United States Patent
Paul et al.

(10) Patent No.: US 10,677,868 B2
(45) Date of Patent: Jun. 9, 2020

(54) MAGNETIC RESONANCE APPARATUS AND METHOD THAT COMBINE DATA ACQUISITION TECHNIQUES WHEREIN CARTESIAN SCANNING OF K-SPACE IS CHANGED, WITH ACCELERATED IMAGING TECHNIQUES REQUIRING REFERENCE DATA

(71) Applicant: Siemens Healthcare GmbH, Erlangen (DE)

(72) Inventors: Dominik Paul, Bubenreuth (DE); Flavio Carinci, Erlangen (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/270,654

(22) Filed: Feb. 8, 2019

(65) Prior Publication Data
US 2019/0242962 A1    Aug. 8, 2019

(30) Foreign Application Priority Data
Feb. 8, 2018 (EP) ..................... 18155718

(51) Int. Cl.
*G01R 33/48* (2006.01)
*G01R 33/56* (2006.01)
(Continued)

(52) U.S. Cl.
CPC ....... *G01R 33/482* (2013.01); *G01R 33/4818* (2013.01); *G01R 33/4835* (2013.01);
(Continued)

(58) Field of Classification Search
CPC .............. G01R 33/482; G01R 33/4818; G01R 33/5608; G01R 33/583; G01R 33/5611; G01R 33/4835
See application file for complete search history.

(56) References Cited

U.S. PATENT DOCUMENTS

| 2003/0164701 A1* | 9/2003 | Wang ................. G01R 33/5611 324/307 |
| 2008/0303521 A1 | 12/2008 | Beatty et al. |
| 2018/0017655 A1* | 1/2018 | Zeller .................. G01R 33/583 |

OTHER PUBLICATIONS

Pipe, "Motion Correction With PROPELLER MRI: Application to Head Motion and Free-Breathing Cardiac Imaging" Magnetic Resonance in Medicine, vol. 42, No. 5, pp. 963-969, (1999).
(Continued)

*Primary Examiner* — G.M. A Hyder
(74) *Attorney, Agent, or Firm* — Schiff Hardin LLP

(57) ABSTRACT

A magnetic resonance apparatus and method acquire magnetic resonance data with a recording technique in which the Cartesian scanning of k-space is carried out differently, by a rotation of gradient directions around the center of k-space, for different recording sections of a respective part of the magnetic resonance data, and this recording technique is combined with an accelerating imaging technique for which reference data completely describing a reference range around the center of k-space are used for each individual slice to be scanned. At the beginning of the recording, a calibration area of k-space, which includes all the reference ranges required in the course of recording, is determined and a calibration data set of k-space is recorded in a calibration measurement with complete, Cartesian scanning of the calibration area. Reference data for each recording section are determined from this calibration data set.

9 Claims, 3 Drawing Sheets

(51) Int. Cl.
  *G01R 33/58* (2006.01)
  *G01R 33/561* (2006.01)
  *G01R 33/483* (2006.01)
(52) U.S. Cl.
  CPC ...... *G01R 33/5608* (2013.01); *G01R 33/5611* (2013.01); *G01R 33/583* (2013.01)

(56) References Cited

OTHER PUBLICATIONS

Norbeck, et al. "Self-Calibrated Simultaneous Multi-Slice PROPELLER" Proceedings of the International Society for Magnetic Resonance in Medicine; ISMRM; 23rd Annual Meeting and Exhibition; Toronto; Ontario; Canada; May 30-Jun. 5, 2015; No. 245 (2015).

Holmes,. et al. "T1 FLAIR PROPELLER with parallel imaging using simultaneous crossed blade calibration APPEAR" Proceedings of the International Society for Magnetic Resonance in Medicine; ISMRM 20th Annual Meeting and Exhibition; Melbourne/Australia; May 5-11, 2012 (2012).

* cited by examiner

MAGNETIC RESONANCE APPARATUS AND METHOD THAT COMBINE DATA ACQUISITION TECHNIQUES WHEREIN CARTESIAN SCANNING OF K-SPACE IS CHANGED, WITH ACCELERATED IMAGING TECHNIQUES REQUIRING REFERENCE DATA

BACKGROUND OF THE INVENTION

Field of the Invention

The invention concerns a method for operating a magnetic resonance device when recording magnetic resonance data with a recording technique in which Cartesian scanning of k-space is carried out differently, by a rotation of gradient directions around the center of k-space, for different recording sections of a respective part of the magnetic resonance data, wherein the recording technique is combined with an accelerating imaging technique for which reference data completely describing a reference range around the center of k-space is used for each individual slice to be scanned. The invention also concerns a magnetic resonance apparatus and a non-transitory, electrically readable data carrier that implement such a method.

Description of the Prior Art

Magnetic resonance imaging is an established imaging technique in the medical field. A crucial objective of current research is to reduce recording times for acquiring magnetic resonance data from patients while still obtaining the highest possible image quality. Suitable accelerated imaging techniques are, for example, techniques for multi-slice imaging, which is also often referred to as SMS imaging (Simultaneous Multi-Slice). In this case, nuclear spins in multiple slices are excited within a repetition of the excitation pulse and the magnetic resonance signals from these slices are received (detected) simultaneously. Subsequently, items of magnetic resonance data of the individual slices are algorithmically separated from one another, using methods such as GRAPPA. Reference data for the individual slices, which are obtained in so-called reference measurements, are required to separate the magnetic resonance data of the individual slices. Usually, the central region of k-space around the center of k-space is scanned (filled with required MR data) completely for the reference data.

In principle, for recordings of a single slice it is possible to undersample external areas of k-space, and to record reference lines in central k-space during normal magnetic resonance data recording from the slice by complete scanning of central k-space, so that the reference data and the magnetic resonance data are present in the same coordinate system. If a number of slices are simultaneously scanned, it is known to use "external" reference measurements, which are acquired as separate scans before/after the actual magnetic resonance data recording. The scanning of k-space takes place for such additional "external" reference measurements according to the scanning for the recording of magnetic resonance data, so that here as well reference data and magnetic resonance data are present in the same coordinate system.

Problems arise when multi-slice imaging or such a multi-slice technique or another accelerating imaging technique that use reference data are to be combined with recording techniques that alter, in particular rotate, the coordinate system in k-space during the recording of the magnetic resonance data between different recording sections. Then the reference data for each recording section must be recorded again, involving significant amount of time. As a result, the advantage of the speed that would be obtained by the accelerated imaging technique may be lost. Further negative consequences include an increased SAR burden as a result of the additional reference measurements, and negative effects due to T2 decay. These include either intensified blurring in an increased number of recorded lines in k-space, or a reduced number of recorded lines in k-space to avoid blurring, and consequently a higher number of necessary repetitions to fully scan k-space.

An example of a recording technique in which Cartesian scanning of k-space in different recording sections is changed to compensate for movement is the so-called PROPELLER technique, which may also be referred to as the BLADE technique, as described in the article by J. G. Pipe, "Motion correction with PROPELLER MRI: application to head motion and free-breathing cardiac imaging", Magn. Reson. Med. 42 (1999), pp. 963-969. In this case, the phase coding direction and the readout direction are rotated around the center of k-space.

As noted above, reference data are not only used as an accelerating imaging technique in multi-slice imaging, but also for other accelerating imaging techniques, for example, parallel imaging techniques (PAT—Parallel Acquisition Technique), such as SENSE or the like. Here, transmitter and/or receiver coils with a number of coil elements are used to form a number of transmit and/or reception channels. Reference data from the center of k-space for all the slices to be scanned are also required for such accelerating imaging techniques. When combined with techniques in which Cartesian scanning of k-space is changed, this also results in the need to re-record the reference data for each recording section.

SUMMARY OF THE INVENTION

The object of the invention is therefore to enable accelerated recording and/or improved image quality when combining recording techniques using different Cartesian scanning schemes with accelerated imaging techniques.

This object is achieved in accordance with the invention by a method of the aforementioned type wherein according to the invention, at the beginning of the recording, a calibration area of k-space, that includes all the reference ranges required in the course of recording, is determined, and a calibration data set of k-space is recorded in a calibration measurement with the magnetic resonance scanner with complete Cartesian scanning of the calibration area, and wherein reference data for each recording section are determined from the calibration data set.

According to the invention, a calibration data set is recorded (acquired) in a separate recording process, from the calibration data of which all the reference data required for the different recording sections can be derived. For this purpose, a calibration area of k-space is determined and scanned, which is so large that each reference range that is required, in particular rotated, for the individual recording sections is contained in this calibration area. Instead of recording reference data in individual recording sections themselves, integrated into the recording of magnetic resonance data, a separate calibration measurement is performed in accordance with the invention. When magnetic resonance image data sets are reconstructed from diagnostic magnetic resonance data that were entered into a recording section of k-space, the required reference data are derived from the calibration data set for the corresponding reference range.

The invention thus allows recording sections in which another coordinate system in k-space, i.e., an altered Cartesian scan in k-space, reference data therefor to be derived without providing additional, time-consuming, individual reference measurements. This allows an acceleration in the combination of such recording techniques with accelerated imaging techniques, In particular, the invention enables the meaningful realization of the combination of a multi-slice technique with such a recording technique, whereas in conventional multi-slice imaging it would not be possible to record reference data of individual slices "integrated" into the recording of the magnetic resonance data as the magnetic resonance signals of all the slices are received. Improved image quality is also possible because the additional time which is gained by the omission of reference measurements, which may also involve the scanning of additional lines in k-space when recording magnetic resonance data, can be used to improve the image quality. For example, blurring can be reduced because the usable echo train length is increased as a result of the separate recording of the calibration data on which to base the reference data when recording the magnetic resonance data.

As noted, a multi-slice technique with simultaneous excitation of multiple slices for recording and readout of associated magnetic resonance data can be used expediently as an imaging technique in a common readout period (SMS). In addition, or alternatively, a parallel imaging technique can be used as the accelerating imaging technique wherein multiple coil elements of a transmitter and/or receiver coil (PAT) are used. A PROPELLER technique (BLADE technique) is preferably used such as a recording technique, in which the phase coding direction and the readout direction are rotated around the center of k-space. In practice, this means that the lines to be recorded in the recording sections are also rotated in k-space accordingly, like the recording area scanned in k-space.

With regard to the use of the PROPELLER technique as a recording technique, it should be noted that the calibration area of k-space scanned in the calibration measurement are selected such that sufficiently wide coverage for reconstruction can be achieved in the current phase coding direction for each PROPELLER rotation. In this case, it should be pointed out that k-space expansion or resolution in the readout direction is only secondary for the reconstruction if, in the reconstruction from the reference data, it is only necessary to determine sensitivities of individual coil elements. This can also be achieved with reference data and thus a calibration data set of reduced spatial resolution.

Expediently, the Cartesian scanning during calibration measurement may correspond to the Cartesian scanning of at least one recording section for which the calibration data of the reference range are determined as the reference data from the calibration data set. Particularly expediently, if the calibration data set is measured at the beginning of the recording of the magnetic resonance data, the Cartesian scanning during calibration measurement corresponds to the Cartesian scanning for the first recording section, for which the corresponding calibration data of the first reference range can then be used directly as reference data.

In a recording technique involving a rotation of gradient directions around the center of k-space, a current reference range can be determined by corresponding rotation of the reference range used before the rotation. This means that ultimately the reference range can be "co-rotated", so to speak, within the calibration area in order to mark which calibration data is relevant for the determination of reference data.

The reference data for at least part of the recording sections is preferably determined by regridding and/or interpolation. For example, for the rotated, currently relevant reference range, in many cases the calibration data are stored in the wrong grid and/or in the wrong positions. It is therefore expedient to derive reference data that are as correct and suitable as possible from the correct, desired grid, which is defined by the Cartesian scanning of the recording section, by regridding, i.e., assignment to the correct grid points of the scan in the recording section, and/or interpolation from the calibration data. Various interpolation techniques can be used. For example, the method of "Grappa Operator Gridding" (GROG) can be used expediently for regridding and/or for interpolation. The advantage of conversion to the correct, required grid is in particular that subsequent reconstruction steps of the magnetic resonance data can be carried out as has hitherto been customary, regardless of the use of the calibration data set.

As noted, the time gained by omission of individual reference measurements for reference data of the recording sections can be used to accelerate image recording overall. However, in an embodiment of the present invention the amount of recording time that is saved by the omission of individual reference measurements for reference data of the recording sections is at least partially used to increase the resolution and/or the image sharpness when scanning k-space. In the example of a conventional PROPELLER technique with PAT and/or SMS, it is customary for each echo train, in particular, each recording section/each rotation of the coordinate system (in k-space), to record new reference data, which, if applicable, are combined with the recording of magnetic resonance data. The additional recording of reference data extends the total recording time, and if applicable, the echo time is therefore extended. If, according to the invention, the calibration data set are now recorded separately and the reference data are derived therefrom, either the echo time can be reduced accordingly and/or a higher resolution k-space scan can be realized with the same or a somewhat shorter/longer echo time, in order to improve the resolution/image sharpness. The method according to the invention thus provides both the possibility of achieving faster overall recording times and an improved image quality.

In addition to the method, the invention also encompass a magnetic resonance apparatus having a control computer designed to operate the apparatus scanner as to implement the method according to the invention. All embodiments relating to the method according to the invention apply analogously to the magnetic resonance apparatus according to the invention, with which the aforementioned advantages can therefore also be obtained. In this case, the control computer can be used in addition to the sequence controller, which is usually provided in any case, in order to implement imaging tasks that can then also perform calibration measurement. The control computer includes a calibration area determination processor that determines the calibration area, and a reference data determination processor that determines reference data for a recording section from the calibration data set.

The present invention also encompasses a non-transitory, computer-readable data storage medium encoded with programming instructions that, when the storage medium is loaded into a control computer or computer system of a magnetic resonance apparatus, cause the control computer or computer system to operate the magnetic resonance apparatus so as to implement any or all embodiments of the method according to the invention, as described above.

The data carrier can be, for example, a CD-ROM.

DESCRIPTION OF THE PREFERRED EMBODIMENTS

Figure 1:
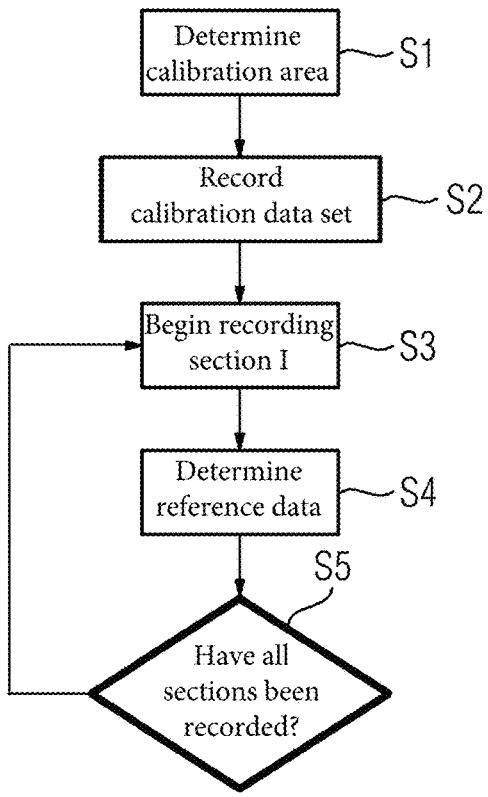
FIG. 1 is a flowchart of an exemplary embodiment of the method according to the invention.

FIG. 1 shows a flowchart of an exemplary embodiment of the method according to the invention. In the present case, a PROPELLER technique is used as a recording technique and is combined with at least one accelerating imaging technique, which can be parallel imaging technique (PAT) and/or a multi-slice imaging technique (SMS), for example. Reference data are required for the accelerating imaging techniques, which should be from a relevant reference range with correct scanning according to the current rotation of the coordinate system of k-space in the corresponding recording section. In order to achieve this without reference measurements having to be measured within or in addition to the recording of magnetic resonance data in the individual recording sections themselves, in step S1, in the present case before the beginning of the recording of the magnetic resonance data, a calibration area is determined, In step S2, a calibration data set is recorded for this calibration area. From this calibration data set it is subsequently possible to derive reference data for all the recording sections of magnetic resonance data in which a different scanning scheme of k-space is used, and thus in particular, another coordinate system with other, here rotated, gradient directions.

Figure 2:
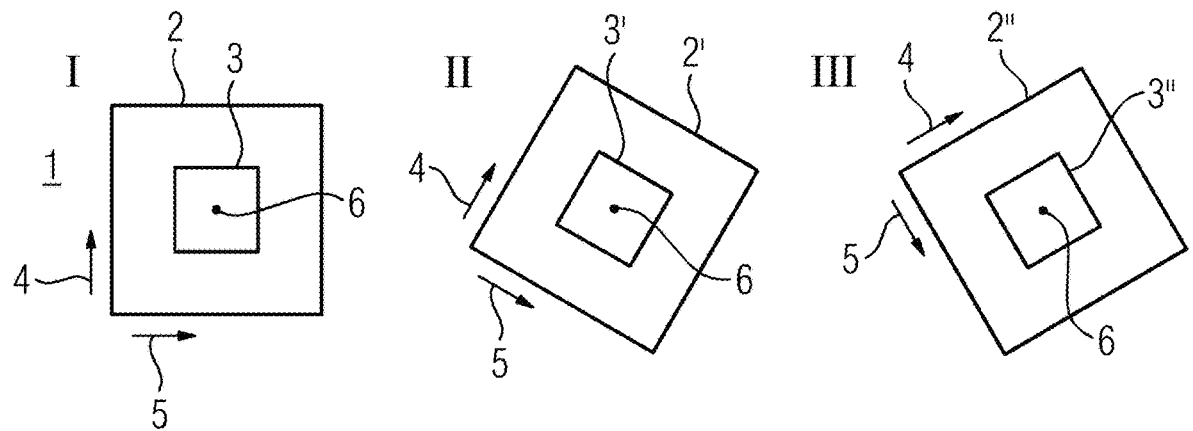
FIG. 2 is a diagram to explain altered recording and reference areas when a PROPELLER technique is used as a recording technique according to the invention.

For this purpose, FIG. 2 illustrates in k-space 1, for different recording sections I, II and III, the position of the recording area 2, 2', 2", and the position of the reference range 3, 3', 3" within the respective recording area 2, 2', 2", which are required for the reference data. In this case, arrows indicate the phase coding direction 4 and the readout direction 5 (Readout—RO). As is readily apparent, the coordinate system provided by the phase coding direction 4 and the readout direction 5 is rotated around the center of k-space 6 for the different recording sections I, II and III. After k-space 1 in the recording area 2, 2', 2" is scanned along lines in the readout direction 5, its orientation also changes accordingly.

Figure 3:
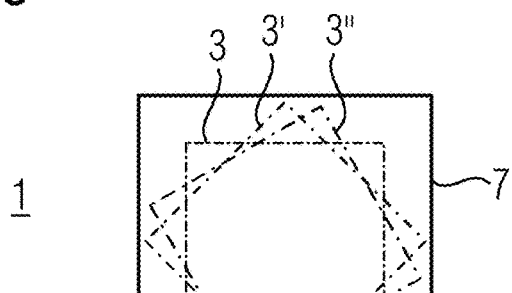
FIG. 3 is a diagram that illustrates determination of the calibration area according to the invention.

Reference data for all the occurring reference ranges 3, 3', 3" are now derived from a calibration data set, for which reason, cf. FIG. 3, in step S1 a calibration area 7 within which all the reference ranges 3, 3', 3" lie is determined, as shown.

In step S2 calibration data are now recorded for this calibration area 7, in particular using the magnetic resonance sequence on which the PROPELLER recording technique is based or an assigned reference data sequence. In the present case, the phase coding direction 3 and the readout direction 5 in k-space 1 are selected in step S2 such that they correspond to the corresponding directions in the first recording section I.

In a step S3, cf. FIG. 1, a first recording section I now begins. Diagnostic magnetic resonance data are recorded accordingly, without additional reference measurements for reference data being necessary, whether integrated into the recording of the magnetic resonance data or in addition to this. Consequently, recording time is saved, which can be used to shorten overall measurement, but can also be used to record additional magnetic resonance data/extend the echo times in order to increase the image quality.

Figure 4:
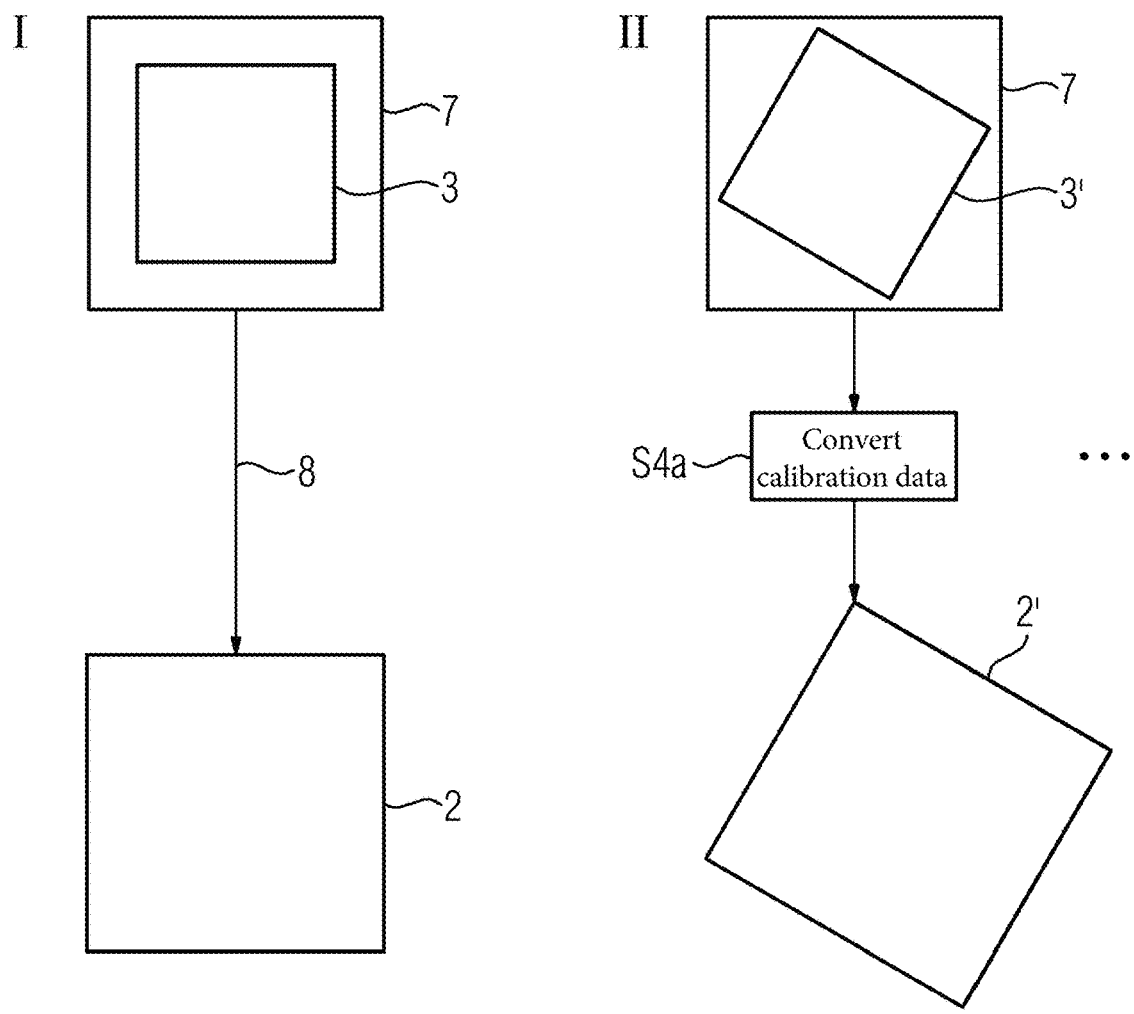
FIG. 4 is a further diagram for explaining the method according to the invention.

In the reconstruction for a recording section, here shown immediately afterward in step S4 (but which can also take place at a later stage), the appropriate reference data in the appropriate reference area 3, 3', 3" are now determined from the calibration data set, as indicated by FIG. 4. For the recording section I, the Cartesian scan of k-space 1, hence the directions 4 and 5, coincides with those used in the recording of the calibration data set, so that the calibration data can simply be used as reference data directly in the reference range 3, as indicated by the arrow 8.

In a subsequent recording section II, however, the phase coding direction 4 and the readout direction 5 of the recording of the calibration data set no longer coincide with the currently used directions 4, 5 so that, in a step S4a as a sub-step of step S4, the calibration data from the then current reference range 3' are first converted by interpolation and regridding into the correct Cartesian scanning grid, which is used for the recording of the magnetic resonance data in the recording area 2'. The reference data thus formed (here, for example, using the "GRAPPA Operator Gridding" method (GROG)), are then used for reconstruction in a computer using the magnetic resonance data of the corresponding recording section II. The same applies to further recording sections. The reconstructed image data are then available from the computer in electronic form, as a data file.

As indicated by step S5, cf. FIG. 1, steps S3 and S4 are repeated until all the intended recording sections have been carried out.

Figure 5:
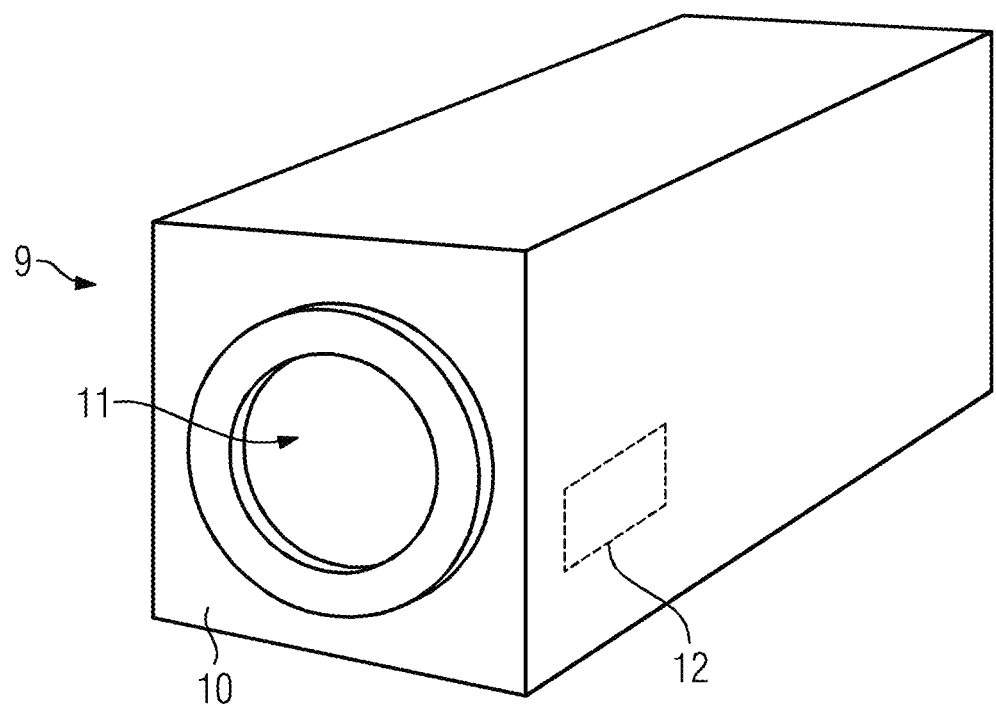
FIG. 5 is a block diagram of a magnetic resonance apparatus according to the invention.

FIG. 5 is a block schematic diagram of a magnetic resonance apparatus 9 according to the invention which, despite the simplified representation, has all the usual components. An MR data acquisition scanner 10 has a basic field magnet, and defines a patient receptacle 11 into which a patient can be moved on a patient bed. Surrounding the patient receptacle 11, a gradient coil arrangement and a radio-frequency coil arrangement are provided, as usual.

The operation of the magnetic resonance apparatus 9 is controlled by a control computer 12, which is designed to carry out the method according to the invention. For this purpose the control computer has a calibration area determination processor that implements step S1, a sequence controller that implements steps S2 and S3, and a reference data determination processor that determines corresponding sub-steps of step S4.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating an magnetic resonance (MR) apparatus comprising:
   from a computer, operating an MR data acquisition scanner to acquire MR data from a plurality of slices of a subject by executing combined techniques respectively comprising a technique wherein Cartesian scanning of k-space is implemented differently for different recording sections of respective parts of the MR data, and an accelerated imaging technique for which reference data, which completely describe a reference range around a center of k-space, are used for each individual slice of said slices;

in said computer, determining a calibration area of k-space that comprises all of said reference ranges;

from said computer, before beginning execution of said combined techniques, operating said MR data acquisition scanner to acquire a calibration data set that is entered into k-space with complete Cartesian scanning of said calibration area; and in said computer, determining said reference data for each recording section from said calibration data set.

2. A method as claimed in claim 1 wherein said recording technique in which said Cartesian scanning of k-space is changed for said different recording sections comprises a technique in which changing said Cartesian scanning is implemented by rotation of gradient directions around the center of k-space.

3. A method as claimed in claim 1 comprising selecting said accelerated imaging technique from the group consisting of a multi-slice technique with simultaneous excitation of a plurality of slices and readout of associated MR data in a common readout period, a parallel imaging technique using a plurality of coil elements of at least one of a radio-frequency transmitter and a radio-frequency receiver, and a PROPELLER technique.

4. A method as claimed in claim 1 comprising operating said MR data acquisition scanner with said Cartesian scan in said acquisition of said calibration data set corresponds to said Cartesian scan of at least one of said recording sections for which the calibration data of the reference range are determined as the reference data from the calibration data set.

5. A method as claimed in claim 1 wherein said technique in which the Cartesian scanning of k-space is implemented differently for said different recording sections comprises rotation of gradient directions around the center of k-space, and, in said computer, determining a current reference range by corresponding rotation of the reference range that was used before rotation.

6. A method as claimed in claim 1 comprising determining said reference data for at least some of said recording sections by at least one of regridding and interpolation of calibration data in said calibration data set.

7. A method as claimed in claim 1 wherein operating said MR data acquisition scanner with said combined techniques produces a time saving, and, from said computer, using said time saving to increase at least one of resolution or image sharpness during scanning of k-space.

8. A magnetic resonance (MR) apparatus comprising:

an MR data acquisition scanner;

a computer configured to operate said MR data acquisition scanner to acquire MR data from a plurality of slices of a subject by executing combined techniques respectively comprising a technique wherein Cartesian scanning of k-space is implemented differently for different recording sections of respective parts of the MR data, and an accelerated imaging technique for which reference data, which completely describe a reference range around a center of k-space, are used for each individual slice of said slices;

said computer being configured to determine a calibration area of k-space that comprises all of said reference ranges;

said computer, before beginning execution of said combined techniques, being configured to operate said MR data acquisition scanner to acquire a calibration data set that is entered into k-space with complete Cartesian scanning of said calibration area; and said computer being configured to determine said reference data for each recording section from said calibration data set.

9. A non-transitory, computer-readable data storage medium encoded with programming instructions, said storage medium being loaded into a computer of a magnetic resonance (MR) apparatus comprising an MR data acquisition scanner, said programming instructions causing said computer to:

operate said MR data acquisition scanner to acquire MR data from a plurality of slices of a subject by executing combined techniques respectively comprising a technique wherein Cartesian scanning of k-space is implemented differently for different recording sections of respective parts of the MR data, and an accelerated imaging technique for which reference data, which completely describe a reference range around a center of k-space, are used for each individual slice of said slices;

determine a calibration area of k-space that comprises all of said reference ranges;

before beginning execution of said combined techniques, operate said MR data acquisition scanner to acquire a calibration data set that is entered into k-space with complete Cartesian scanning of said calibration area; and determine said reference data for each recording section from said calibration data set.

* * * * *